US008339208B2

(12) United States Patent
Luong et al.

(10) Patent No.: US 8,339,208 B2
(45) Date of Patent: Dec. 25, 2012

(54) METHOD AND APPARATUS FOR TUNING FREQUENCY OF LC-OSCILLATORS BASED ON PHASE-TUNING TECHNIQUE

(75) Inventors: Howard Cam Luong, Hong Kong (CN); Sujiang Rong, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 12/796,493

(22) Filed: Jun. 8, 2010

(65) Prior Publication Data
US 2011/0298549 A1 Dec. 8, 2011

(51) Int. Cl.
*H03B 5/12* (2006.01)
(52) U.S. Cl. ........ 331/117 FE; 331/57; 331/46; 331/48; 331/50
(58) Field of Classification Search .............. 331/108 B, 331/135, 137, 117 R, 117 FE, 167, 57, 45, 331/46, 50, 48, 55, 172
See application file for complete search history.

(56) References Cited

U.S. PATENT DOCUMENTS

| | | | |
|---|---|---|---|
| 5,418,497 A | 5/1995 | Martin | |
| 6,005,448 A | 12/1999 | Pickering et al. | |
| 6,204,733 B1 | 3/2001 | Cai | |
| 6,650,188 B1 * | 11/2003 | Chan et al. | 331/46 |
| 6,690,243 B1 | 2/2004 | Henrion | |
| 2006/0055442 A1 * | 3/2006 | Tanaka et al. | 327/231 |
| 2006/0055472 A1 * | 3/2006 | Bietti et al. | 331/57 |
| 2008/0042754 A1 | 2/2008 | Chen | |
| 2008/0265963 A1 * | 10/2008 | Bock | 327/246 |

OTHER PUBLICATIONS

Liu, "A 6.5GHz monolithic CMOS voltage-controlled oscillator," 1999 IEEE International Solid-State Circuits Conference (ISSCC99) Session 23, Paper WP 23.7, 404-405 and 484 (1999).
Nguyen, "A 1.8-GHz monolithic LC voltage-controlled oscillator," IEEE Journal of Solid-State Circuits, 27 (3): 444-450 (Mar. 1992).
Rong et al., "Design and analysis of varactor-less interpolative-phase-tuning millimeter-wave *LC* oscillators with multiphase outputs," IEEE Journal of Solid-State Circuits, 46 (8): 1810-1819 (Aug. 2011).

* cited by examiner

*Primary Examiner* — Ryan Johnson
(74) *Attorney, Agent, or Firm* — Leydig, Voit & Mayer, Ltd.

(57) ABSTRACT

A tunable multiphase ring oscillator includes a plurality of stages connected in series in a ring structure, where each stage generating a stage output from a stage input. Each stage of the tunable multiphase ring oscillator includes a plurality of trans-conductance cells, each generating an output from at least one portion of the stage input. Each stage further includes at least one phase shifting module for imparting at least one phase shift to the at least one portion of the stage input, an oscillator unit for generating the stage output from a combination of the plurality of outputs, and means for varying at least one of the plurality outputs so as to adjust a phase of the stage output.

12 Claims, 17 Drawing Sheets

METHOD AND APPARATUS FOR TUNING FREQUENCY OF LC-OSCILLATORS BASED ON PHASE-TUNING TECHNIQUE

FIELD OF THE INVENTION

The present invention relates in general to the field of LC-oscillator and in particular to a multiphase LC-oscillator with a phase-tuning technique.

BACKGROUND OF THE INVENTION

LC-oscillators for generating high purity clock or local oscillation (LO) signals are the key building blocks in wireline and wireless communication systems. And multiple phase clock and LO signals are required in the modern communication systems. In-phase and quadrature-phase (I&Q) signals are required in the zero-IF receivers for modulation or demodulation, and in image-rejection receivers such as Weaver or Hartley architecture. Multiphase LO or clock signals are also required for the phase-array applications and the half-rate clock-and-data recovery (CDR).

In order to receive or transmit the signals from or to channels at different frequencies, as well as to handle process, voltage and temperature variations, the LC-oscillators are required to be frequency tunable in applications. In general, capacitive tuning methods including varactor tuning and switching capacitor array are mostly used to tune the oscillation frequency of the LC-oscillators. However, the capacitive tuning method has its limitations. For example, the tuned capacitors can load the tank seriously and consequently lead to lower operation frequencies and higher power consumptions. The AM-to-PM noise transformations due to the varactor can degrade the phase noise and the stability of the oscillator. Moreover, the capacitive tuning method requires a sufficient range of tuning voltage, which is not available in the deep sub-micron CMOS technologies.

On the other hand, aggressive scaling of CMOS technologies makes it possible to design and integrate voltage-controlled oscillators (VCOs) at millimeter-wave (MMW) frequencies. Compared with those of the radio frequency (RF) VCOs, the spectrum purity of MMW VCOs are much degraded due to the inferior Q factor of the varactors and the serious AM-PM noise transformation caused by the large VCO gain in the order of GHz/V. Moreover, the serious trade-off between varactor's tuning ratio and Q factor as well as the reduced supply voltage in deep sub-micron CMOS technologies make the varactor-tuning method less effective for MMW VCOs.

Here, the Q factor, also known as the quality factor, is a dimensionless parameter that describes how under-damped an electrical oscillator or resonator is, or equivalently, characterizes a resonator's bandwidth relative to its center frequency. Higher Q factor indicates a lower rate of energy loss relative to the stored energy of the oscillator. In other words, the oscillations die out more slowly. On the other hand, oscillators with high Q factors have low damping so that they oscillate longer. In electrical resonant systems, the Q factor is determined by the resistance, inductance, and capacitance of the circuit.

SUMMARY OF THE INVENTION

The present invention provides a method and apparatus for tuning the frequency of a multiphase LC-based ring oscillator without using capacitive tuning.

In general, the method provides a phase-tuning technique for tuning the frequency of the LC-based ring oscillator without using any tunable capacitive components in the LC-tank of each stage. Specifically, the phase tuning LC ring oscillator includes a plurality of stages, each having a differential circuit. The plurality of stages of the oscillator are connected in a ring structure with a main LC-tank in each stage, which provides a certain amount of fixed phase shift in the respective stage. A phase tuning (PT) cell with tunable or equivalently tunable phase shift is provided in each stage. The phase shift induced by the LC-tank in each stage is altered to satisfy the phase condition. Consequently, the oscillation frequency of the ring oscillator can be tuned under well control.

By properly deciding the phase shifting provided by the PT cell, the LC ring oscillator is configured to operate within a frequency range around the peak frequency of the main LC-tank in each stage. The frequency of the LC ring oscillator can be lower, higher or substantially equivalent to the peak frequency. The phase tuning method for the LC ring oscillator circumvents the disadvantages of conventional capacitive tuning, including the tank's quality factor degradation, AM-to-PM noise transformation, and limited tuning range with reduced supply voltage in deep sub-micron CMOS circuits. Moreover, the multiple stages of the ring oscillator provide multiple noise filtering with an optimal Q factors in the LC-tank. As a result, the PT LC ring oscillator can generate high-frequency, wide-tuning-range and low-phase-noise output signals with multiple phases.

In a further embodiment, the PT LC-oscillator, which is implemented in a 0.13-µm CMOS process, generates 8-phase output signals with phase noises of −127.8 dBc/Hz at 10 MHz offset, tuning ranges of 6.8%, and figure of merits (FoMs) of −186.4 dB at 50 GHz, respectively. In another embodiment, the PT LC-oscillator, which is implemented in the 0.13-µm CMOS process, generates 4-phase output signals, with phase noises of −118.5 dBc/Hz at 10 MHz offset, tuning ranges of 9%, and figure of merits (FoMs) of −180.5 dB at 60 GHz, respectively. Compared with conventional integrated MMW frequency VCOs, the PT LC ring oscillators described herein provide much better in phase noise performance and more superior FoMs.

In an alternative embodiment of the present invention, a method is provided for tuning a frequency of a multiphase LC-oscillator, wherein the multiphase LC-oscillator includes a plurality of stages connected in series in a ring structure, and wherein each stage generating a stage output from a stage output. The method includes imparting a phase shift to at least one portion of the stage input, generating a first and second outputs from the phase-shifted portion and the un-shifted portion of the stage input, combining the first and second outputs for forming the stage output, and adjusting a phase of the stage output by varying at least one of the first and second outputs.

According to still an alternative embodiment, a method of provided for tuning a frequency of a multiphase LC-oscillator, wherein the multiphase LC-oscillator includes a plurality of stages connected in series in a ring structure, each stage generating a stage output from a stage input. The method including imparting at least one phase shift to at least one portion of the stage input, combining the plurality outputs for forming the stage output, and adjusting a phase of the stage output by varying at least one of the plurality of outputs.

According to still an alternative embodiment of the present invention, a tunable multiphase ring oscillator is provided. The oscillator includes a plurality of stages connected in series in a ring structure. Each stage generates a stage output from a stage input and includes a plurality of trans-conductance cells, at least one portion of the stage input, an oscillator unit and means for adjusting a phase of the stage output. Each of the trans-conductance cells generates an output from at least one portion of the stage input. The at least one phase shifting module imparts at least one phase shift to the at least one portion of the stage input. The oscillator unit generates the stage output from a combination of the plurality of outputs. The means for adjusting the phase of the stage output includes means for varying at least one of the plurality outputs.

DETAILED DESCRIPTION OF THE PREFERRED EMBODIMENTS

In general, the invention described herein provides a method for tuning the frequency of a multiphase ring oscillator, which includes a plurality of stages connected in series in a ring structure. According to various embodiments of the invention, a phase shift is introduced into an input signal of each stage and the phase of the output signal and hence the frequency of the ring oscillator is adjusted by varying the phase shift of the input signal.

Figure 9:
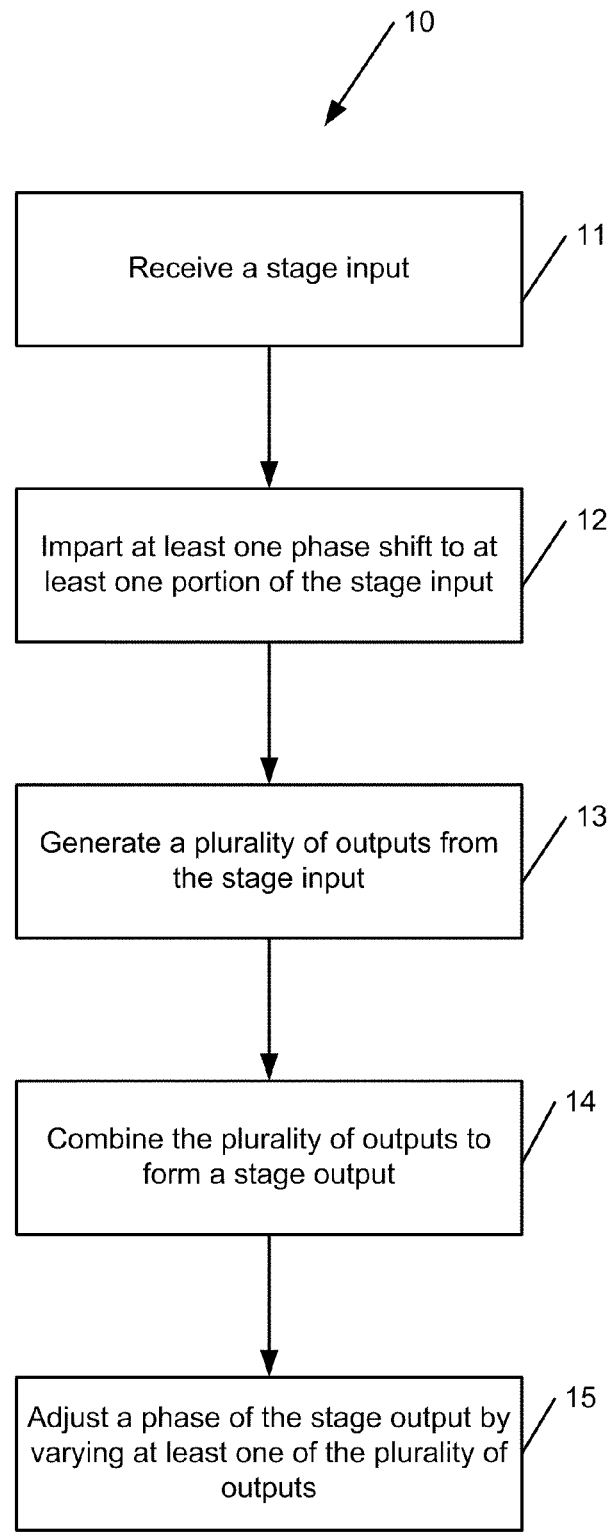
FIG. 9 depicts a flow diagram of a method for adjusting a frequency of a multiphase ring oscillator according to various embodiments of the invention.

According to some alternative embodiments as depicted in FIG. 9, a method 10 is provided to tune the frequency of the multiphase ring oscillator. According to this embodiment, when each stage of the ring oscillator receives an input signal (11), at least one phase shift is imparted to at least one portion of the input signal (12). A plurality of output signals are then generated from the phase shifted portions of the input signal (13). The plurality of the output signals are then combined to form a stage output (14), which is used as the input signal for the next stage. The phase of the stage output and hence the frequency of the ring oscillator are adjusted by varying the at least one of the plurality of output signal (15).

In a further embodiment, the phase shift is introduced into the input signal by variable circuit components including one or more adjustable capacitors and one or more adjustable resistors, before the input signal is input to each stage. The phase shift of each stage and hence the operation frequency of the oscillator are adjusted by tuning the variable circuit components.

In another embodiment, at each stage of the multiphase oscillator, a fixed phase shift in introduced to the input signal to generate a first output signal. In addition, a portion of the un-shifted input signal is used to generate a second set of output signal. The first and second output signals are incorporated to generate a stage output, where the stage output is a vectorial combination of the first and second output signals. The phase shift of the stage output and hence the frequency of the oscillator are adjusted by adjusting at least one of the amplitudes and phases of the first and second output signals.

In still another embodiment, at each stage, a first fixed phase shift is introduced to a first portion of the input signal to generate a first output signal, and a second fixed phase shift is introduced to a second portion of the input signal to generate a second output signal. The first and second output signals are then incorporated to generate a stage output, where the stage output is a vectorial combination of the first and second output signals. The phase shift of the stage output and hence the operation frequency of the oscillator can be adjusted by tuning at least one of the amplitudes of the first and second output signals.

In still another embodiment, at each stage, the input signal is separated into a plurality of portions, and a different phase shift is introduced to each portion of the input signal, respectively. A plurality of output signals, each generated from a phase-shifted portion of the input signal, are combined to produce a stage output, where the stage output is a vectorial combination of the plurality of output signals. The phase shift of the stage output and hence the operation frequency of the oscillator are adjusted by tuning at least one of the amplitudes of the plurality of output signals.

Figure 1A:
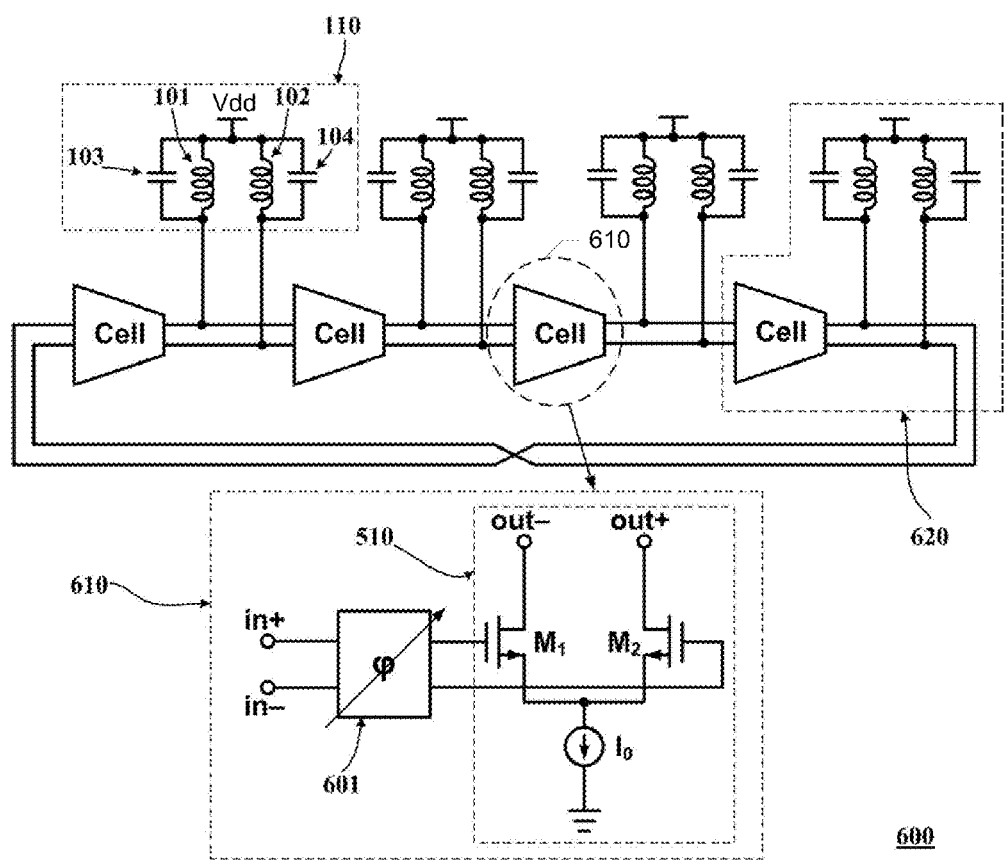
FIG. 1A depicts a circuit diagram of an 8-phase output LC-oscillator in accordance with an exemplary embodiment of the present invention.

Now turning to FIG. 1A, a circuit diagram is depicted therein illustrating a multiphase LC-oscillator 600 including a plurality of stages 620. Each stage 620 includes an LC-tank 110 and a phase tuning cell 610, which has a pair of differential inputs and a pair of differential outputs. The stages of the oscillator are connected in series in a ring structure, where the outputs of the last stage are coupled to the inputs of the first stage.

Each LC-tank 110 includes two basic LC-oscillators connected between a common voltage source Vdd and, respectively, the differential outputs of the phase tuning cell 610. Each basic LC-oscillator 110 includes an inductor 101/102 and a capacitor 103/104, connected in parallel.

In operation, ring oscillator 600 generates a switching transient which propagates continuously around the loop, thereby producing an oscillation. Two conditions must be satisfied to generate stable oscillations. First, total voltage gain around the loop needs to be at least unity, so the oscillation signals do not decay or die out when propagated around the loop. Second, the total phase shift around the loop needs to be zero or in general $2\pi*M$, where M can be any integer number, so the oscillation signals are in phase after propagating around the loop, thereby self-sustainable.

When all of the stages 620 are substantially identical, each stage 620 provides at least a unity gain to satisfy the gain condition and a phase shift of $(\pi+2\pi*M)/N$ to satisfy the phase condition, where N is indicative of the number of stages in the oscillator and the additional $\alpha$ is due to the cross-connection between the last stage and the first stage as shown in FIG. 1A.

In each stage 620, the input voltage signal is firstly converted into a current signal by the trans-conductor cell 610, and then converted back to a voltage signal at the output by the LC-tank 110. When the phase shift component provided by phase shift cell 601 is zero, the total phase shift of the output signal at each stage 620 is provided by the LC-tank 110 according to the phase condition. Accordingly, the oscillator oscillates at a frequency corresponding to the phase shift of the LC-tank 110, i.e., $(n+2\pi*M)/N$. Because of the multiple choices of M, there can be more than one frequency that satisfy the phase condition. As a result, the oscillator can be adjusted to oscillate at the frequency where the impedance of the LC-tank 110 is largest, thereby optimizing the gain condition.

Figure 1B:
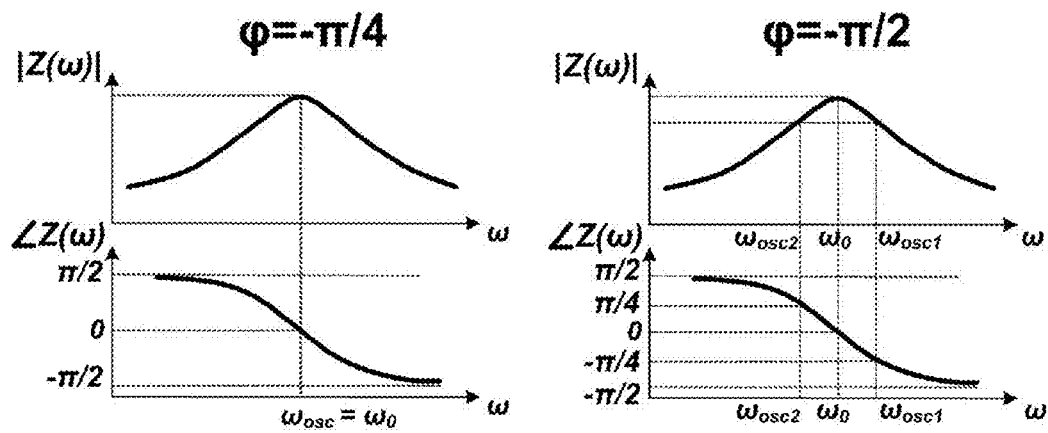
FIG. 1B shows the frequency responses of the LC-tanks in the LC-oscillator depicted in FIG. 1A.

According to the embodiment of a 4-stage oscillator shown in FIG. 1A, at each stage 620, with the extra phase shift $\phi$ 601 added in front of the trans-conductor 510, the phase condition for each stage becomes $\phi+\theta=\pi/4+(\pi/2)*M$. By changing the value of $\phi$, the phase shift $\theta$ provided by the LC-tank 110 is varied accordingly, thereby adjusting the oscillation frequency. The signal phase of the 4-stage oscillator is shown in FIG. 1B. As shown in FIG. 1B, if $\phi=-\pi/4$, the LC-tank 110 need not to provide any phase shift in order for oscillator 600 to operate at the peak frequency of the LC-tank. If, on the other hand, $\phi$ is decreased to $-\pi/2$, the oscillation frequency decreases to $\omega_{osc2}$, which is the boundary of monotonous frequency tuning.

Figure 2A:
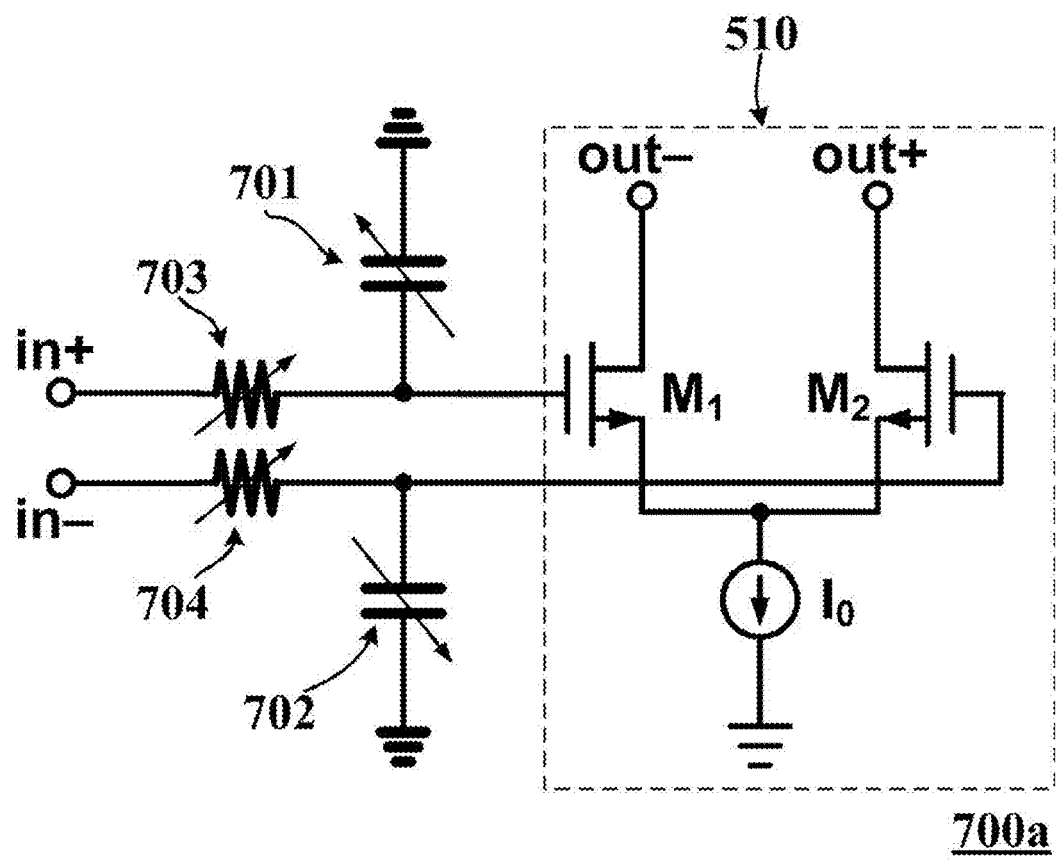
FIGS. 2A, 2B, 2C and 2D depict circuit diagrams of various embodiments of a trans-conductance having a tunable phase shift, used in the present invention.
Figure 2B:
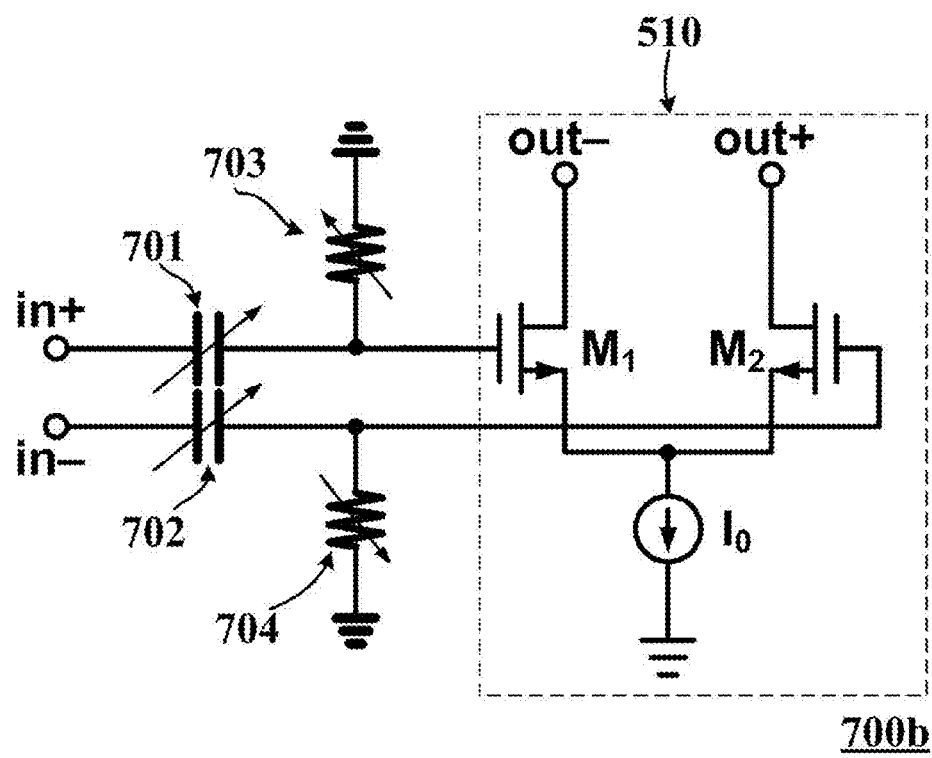

FIGS. 2A-D depict various detailed embodiments of the trans-conductance cell 610 with tunable phase shift as shown in FIG. 1A. In particular, FIGS. 2A and 2B show embodiments of tuning the phase delay by placing tunable capacitors 701 and 702 and/or tunable resistors 703 and 704 in front of the trans-conductor 510.

Figure 2C:
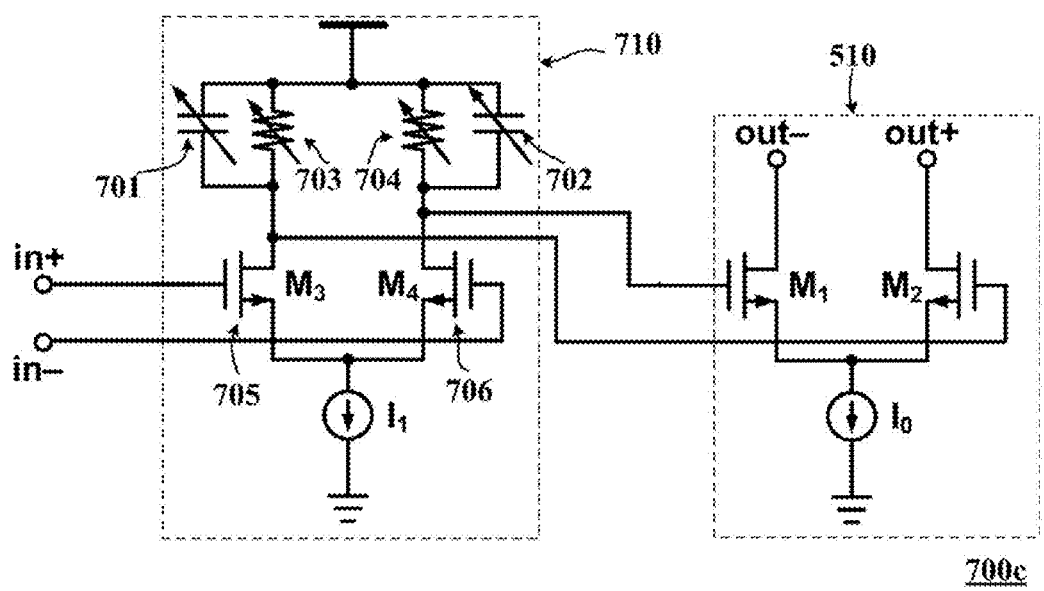

Since the loss due to passive components affects the gain condition of the oscillator, extra active devices, such as transistors 705 and 706, can be used with the tunable capacitors and resistors to form a gain stage 710, as shown in FIG. 2C. Noticed that, in this embodiment, the tunable resistors 703 and 704 can cause extra noises in the oscillator and the phase shift provided by the RC filter is negative.

Figure 2D:
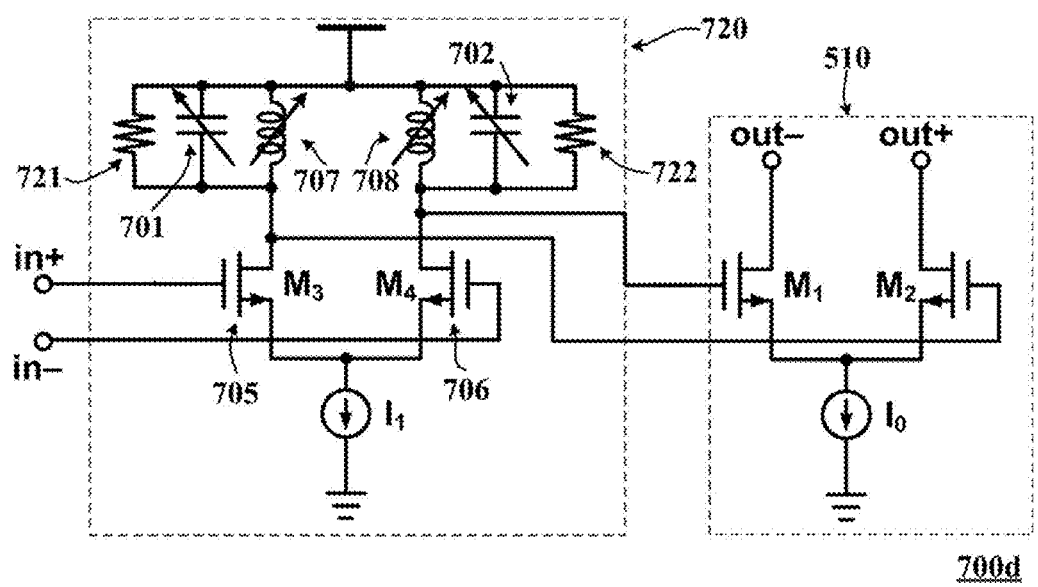

In the embodiment shown in FIG. 2D, the tunable resistors shown in FIG. 2C are replaced by tunable inductors 707 and 708, so as to cause the oscillator 600 oscillates around the peak frequency of the main LC-tank 110. In addition, de-Q resistors 721 and 722 can be added in parallel into the tank in circuit 700*d*.

Figure 3A:
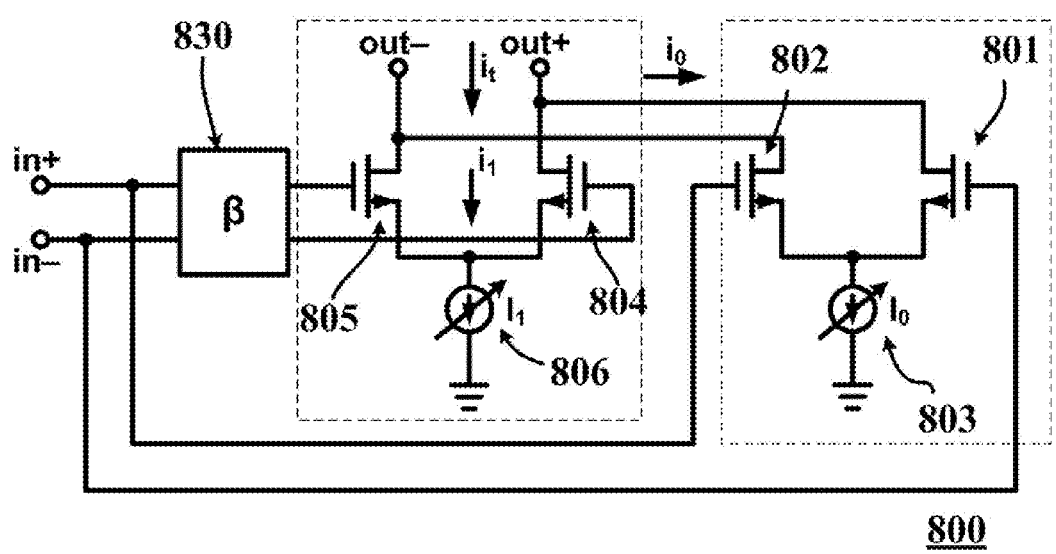
FIG. 3A depicts a circuit diagram of another embodiment of the trans-conductance with a tuning phase shift provided by phase interpolations.
Figure 3B:
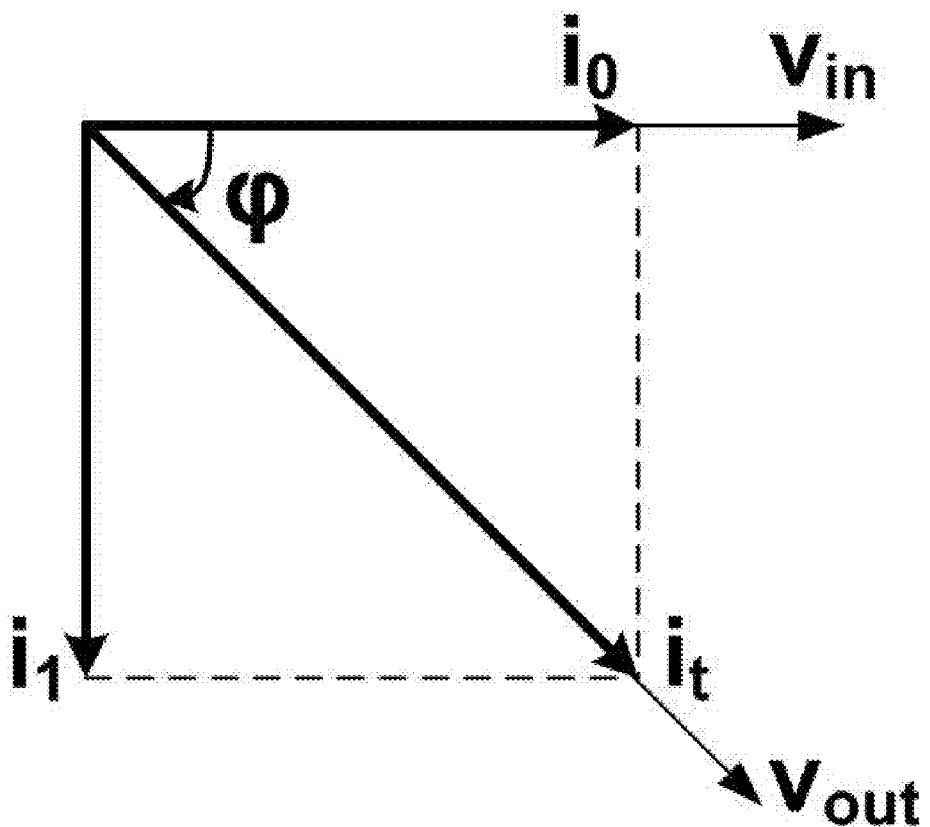
FIG. 3B illustrates a phasor diagram of the current injected into the LC-tank depicted in FIG. 3A.

FIG. 3A provides another embodiment of the trans-conductance cell 610. In this embodiment, a fixed phase shift $\beta$ provide by a fixed-phase shifting module 830 is used to introduce a delayed current $i_1$ generated by the trans-conductance transistors 804 and 805. By combining the delayed current $i_1$ and the un-delayed current $i_0$ provided by the trans-conductance transistors 801 and 802, as shown in FIG. 3B, the delay of the total current $i_t$ can be controlled by tuning the DC current component $I_0$ and $I_1$, which are used to biased the transistor pairs 804 and 805 and 801 and 802, respectively. As depicted in FIG. 3B, currents $i_0$, $i_1$, and $i_t$ are vector representation of the output currents, each determined by an amplitude and a phase. These currents are depicted in FIG. 3B in their vector representations with their relative phase shifts indicated by the angles between the vectors. As shown in FIG. 3B, the output current $i_t$ flowing into the LC-tank is a vectorial combination of the phase-shifted current output $i_1$ and the un-shifted current output $i_0$. The phase of the output current $i_t$ can be tuned by adjusting the amplitude of current $i_0$ and/or $i_1$. This can be achieved by varying the current source 803 and/or 806, accordingly. For example, for a 4-stage PT oscillator, in order to obtain a maximum monotonous tuning range, the phase shift of the LC-tank $\theta$ is adjusted between $-\pi/4$ and $\pi/4$, and thus the phase shift $\phi$ needs to be tunable between 0 and $-\pi/2$. As a result, the phase shift $\beta$ in 800 is set to approximately $-\pi/2$. Since the trans-conductance cell 800 does not need any tunable passive components, it can lower the AM-to-PM noise transformation and provide better phase noise performance and the tuning range is not limited by the supply voltage.

Figure 4A:
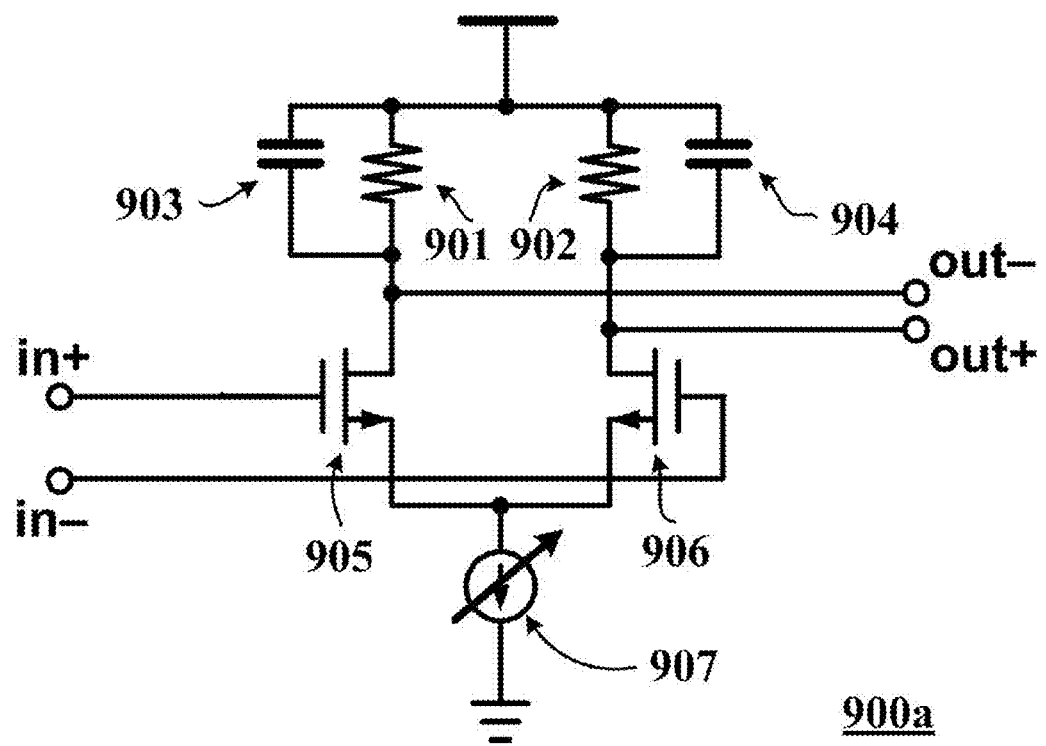
FIGS. 4A and 4B each depict an embodiments of a gain stage with a fixed phase shift, used in the present invention.

The fixed-phase shifting module 830 has a similar structure with the phase tuning modules 710 and 720 in FIGS. 2C and 2D. One embodiment of fixed-phase shifting module 830 is shown in FIG. 4A, where input voltage is applied to the trans-conductance transistors 905 and 906 and converted into current signals, which flows into a differential RC filter including fixed resistors 901 and 902 and fixed capacitors 903 and 904. According to this embodiment, the initial fixed phase shift $\beta$ imparted to the input signals in cell 800 is actually a phase delay, determined by the RC filter's parameters.

Figure 4B:
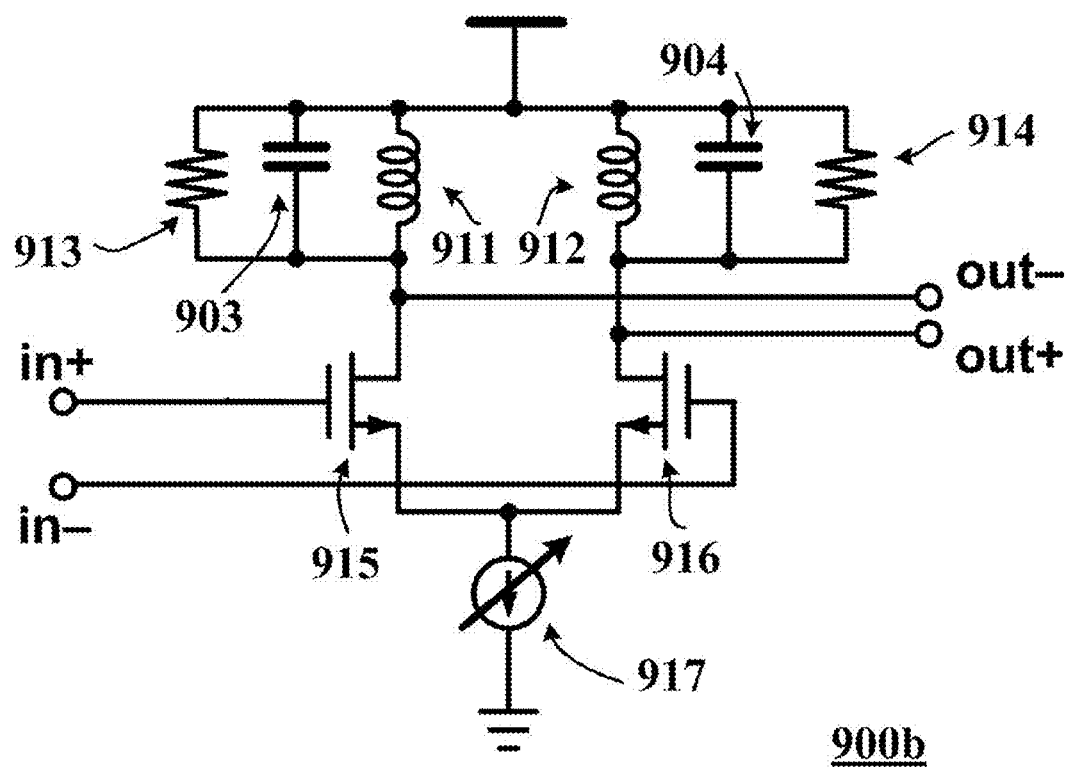

FIG. 4B shows another embodiment of fixed-phase shifting module 830, where the RC filter in 900*a* is replaced by an LC-tank including fixed inductors 911 and 912, fixed capacitors 903 and 904, and de-Q resistors 913 and 914. The LC-tank causes the PT oscillator always operates around the peak frequency of the main LC-tank. According to this embodiment, the fixed phase shift 13 provided by circuit 900*b* can be either positive or negative, depending on whether the LC product of inductor 911/912 and capacitor 903/904 is smaller or larger than the LC product of 101/102 and 103/104 shown in FIG. 1A. In embodiments 900*a* and 900*b*, the tail current 907 and 917 are both tunable, so as to make the amplitude of delayed current $i_1$ in 800 more controllable, and thus facilitate the phase interpolation for the PT oscillator.

Figure 5A:
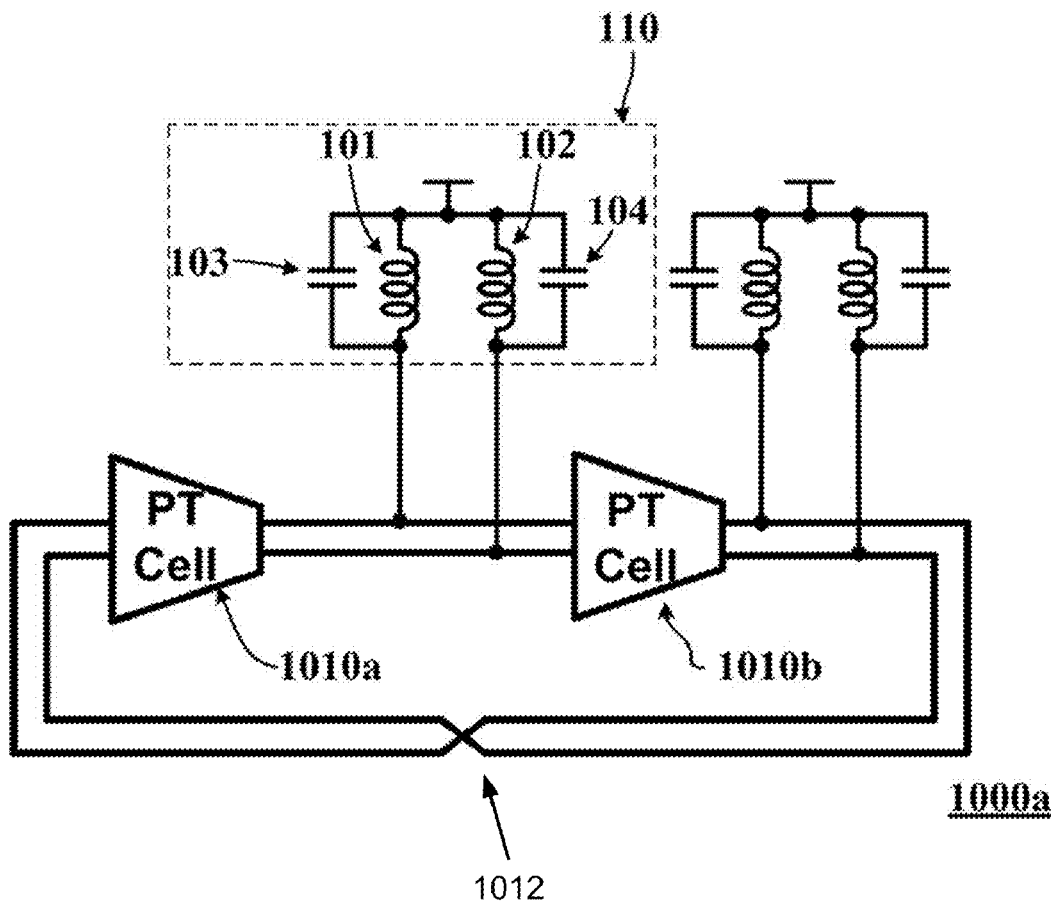
FIG. 5A depicts a circuit diagram of a 4-phase output LC-oscillator in accordance with another exemplary embodiment of the present invention.

FIG. 5A depicts another embodiment of the multiphase oscillator with I and Q phase outputs (PT Q-VCO). Differential phase tuning cells 1010*a* or 1010*b* converts the input voltage signal to a current signal with a controllable phase shift, which is then injected into the LC-tank 110. The stages including the phase tuning cells and LC-tanks are connected in a ring structure having a twisted connection 1012. According to this embodiment of a 2-stage oscillator, each stage provides a phase shift of $\pi/2+2\pi*M$. In order to make the oscillator operate symmetrically around the peak frequency of the LC-tank 110 with a 90 degree tuning range, the phase shift of the LC-tank $\theta$ is adjusted between $-\pi/4$ and $\pi/4$, and thereby the phase shift $\phi$ provided by phase tuning cells 1010*a* and 1010*b* are tunable between $-\pi/4$ and $-3\pi/4$.

Figure 5B:
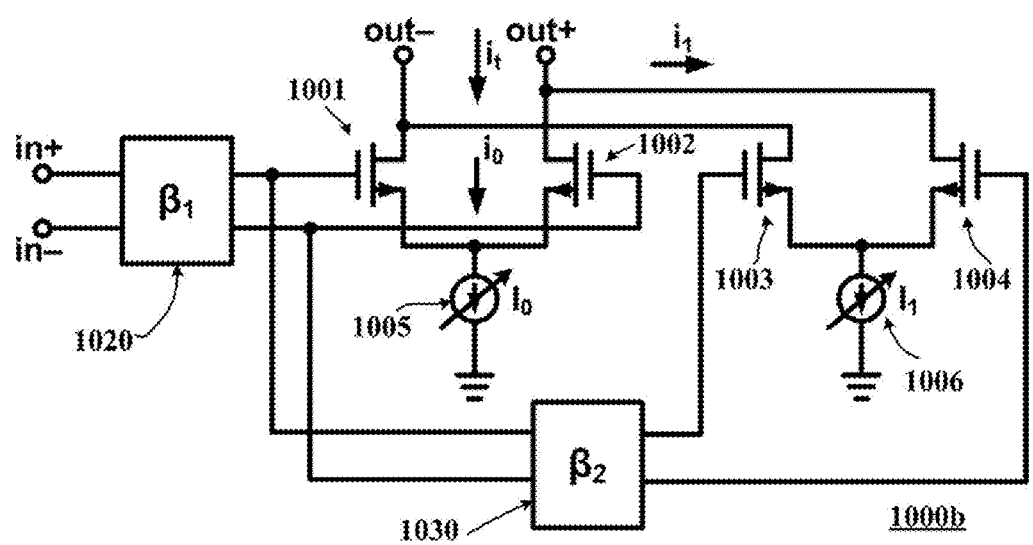
FIG. 5B depicts a circuit diagram of the tunable phase shift trans-conductance in accordance with the embodiment depicted in FIG. 5A.
Figure 5C:
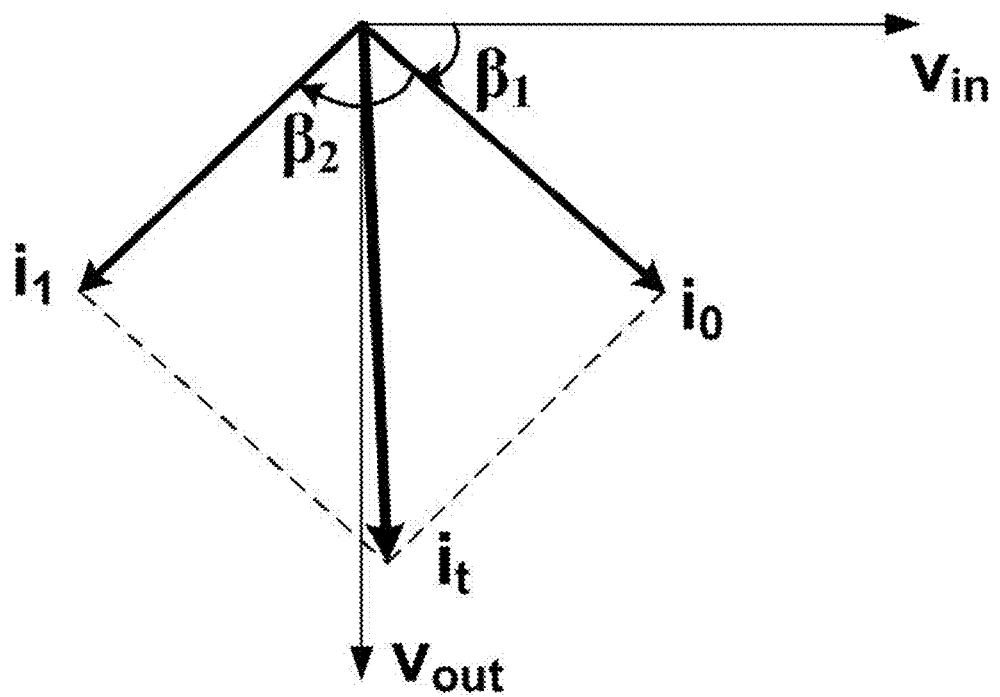
FIG. 5C illustrates a phasor diagram of the current injected into the LC-tank depicted in FIG. 5B.

An embodiment of the phase tuning cells 1010*a* and 1010*b* is depicted in FIG. 5B. According to this embodiment, by introducing the two fixed phase shifts, i.e., $\beta_1=-\pi/4$ and $\beta_2=-\pi/2$, the phase shift of total current $i_t$ can be varied from $-\pi/4$ to $-3\pi/4$ through phase interpolation. FIG. 5C further depicts the operation of the phase interpolation, where current $i_0$ provided by transistors 1001 and 1002 and current $i_1$ provided by transistors 1003 and 1004 are combined to produce total current $i_t$ with a phase shift determined by $\beta_1$, $\beta_2$, and the amplitudes of currents $i_0$ and $i_1$.

In this embodiment, the values of fixed-phase shifts $\beta_1$ and $\beta_2$ depend on the stage number of the PT oscillator, where $\beta_2$ determines the phase tuning range of the oscillator, and $\beta_1$ provides the initial phase shift to make the phase tuning range distributed evenly around the peak frequency of the LC-tank 110. For example, in the PT Q-VCO, $\beta_2$ is set to be close to $-\pi/2$ which can be realized by a second-order LC-tank, and $\beta_1$ is set to $-\pi/4$ so that the phase shift of current $i_r$ can be tuned from $-\pi/4$ to $-\pi 3/4$ with a 90 degree tuning range symmetrically distributed around $-\pi/2$. So the PT Q-VCO can operate in the region with the optimal LC-tank's Q factor. The circuit implementation of the fixed phase shift $\beta_1$ and $\beta_2$ is substantially similar to those depicted in FIGS. 4A and 4B.

Figure 6:
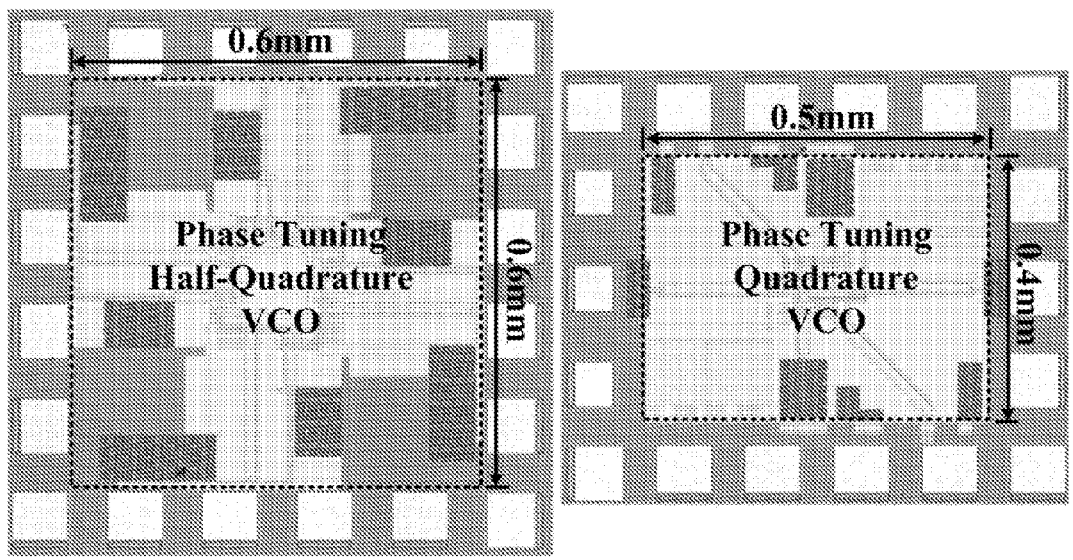
FIG. 6 shows die images of two phase tuning LC-oscillator prototypes, with 50 GHz 8-phase outputs and 60 GHz 4-phase outputs, respectively.

FIG. 6 shows the die images of 0.13-μm CMOS implementations of the 4-stage oscillator (half-Q-VCO) depicted in FIG. 1A and the 2-stage oscillator (Q-VCO) depicted in FIG. 5A, where circuits 800 and 900b are integrated in the oscillator circuits. In FIG. 6, the HQ-VCO and Q-VCO each occupy a 0.36 mm² area and a 0.20 mm² area, respectively. When the differentially-controlled biasing current is tuning from −0.9 mA to 0.9 mA, the HQ-VCO can be continuously tuned from 48.6 GHz to 52 GHz while consuming a total power of 32 mW to 48 mW from a 0.8V supply. The Q-VCO can be continuously tuned from 56 GHz to 61.3 GHz, with a total power consumption of 30 mW to 37 mW from a 0.8V supply. The phase noises vary from −110.2 dBc/Hz to −116.3 dBc/Hz, and from −104.8 dBc/Hz to −110.1 dBc/Hz at 3 MHz offset, for the HQ-VCO and Q-VCO respectively. For the two VCOs circuit shown in FIG. 6, the lowest phase noise is measured when the VCO oscillates at the middle frequency, at which the tank's Q factor is maximized. The figure of merits (FoMs) are −186.4 dB and −180.5 dB at 50 GHz and 60 GHz, calculated with the measured phase noise of −127.8 dBc/Hz and −118.5 dBc/Hz at 10 MHz offset, for the PT 4-stage oscillator and 2-stage oscillator, respectively.

Figure 7:
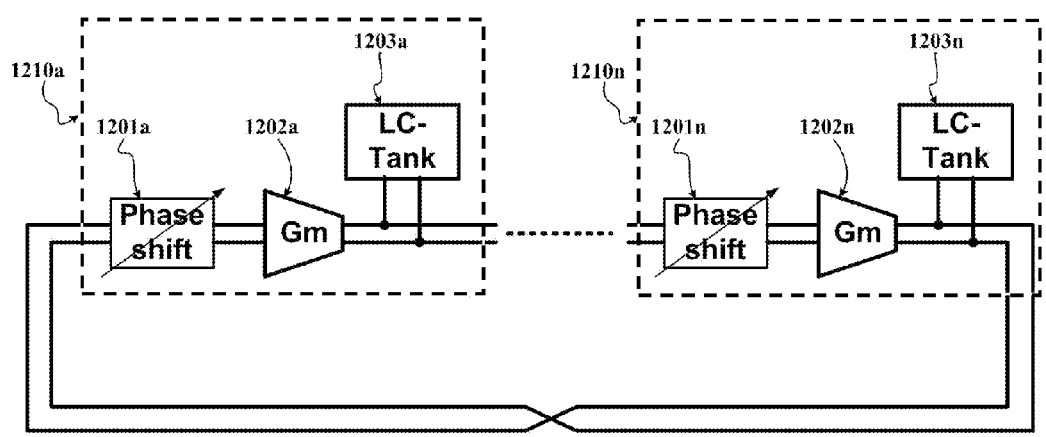
FIG. 7 depicts a schematic diagram of the multiphase phase tuning LC-oscillator in accordance with another embodiment of the present invention.

FIG. 7 shows a phase tuning LC-oscillator 1200 according to another embodiment. Oscillator 1200 includes a plurality of stages, 1210a to 1210n, connected in a ring structure, where each stage has a pair of differential inputs and a pair of differential outputs. The outputs of one stage are connected to the input of the next stage in the ring. The connection from the outputs of last stage 1210n to the inputs of first stage 1210a is twisted, whereas other connections are straight. Each of stages 1210a to 1210n has a phase tuning cell (1201a to 1201n), which imparts a controllable phase shift between the input and output signals. Each stage further includes a trans-conductance cell (1202a to 1202n), which generates output signals in response to the phase-shifted input signals, and a LC-tank (1203a to 1203n), which converts the injected current to the output voltage signals. In general, two output signals are generated at the output nodes of each LC-tank, with the phase of the output signal various from 0 degree to 360(2N−1)/2N degree with a 360*½N degree increment at each stage, where N is indicative of the total number of stages of the oscillator. Because the phase shift provided by each stage is fixed and substantially equal to 180/N degree in practical, varying the phase shift imparted by the tuning cell can change the phase shift of each LC-tank, thereby changing the frequency of the ring oscillator accordingly.

Figure 8:
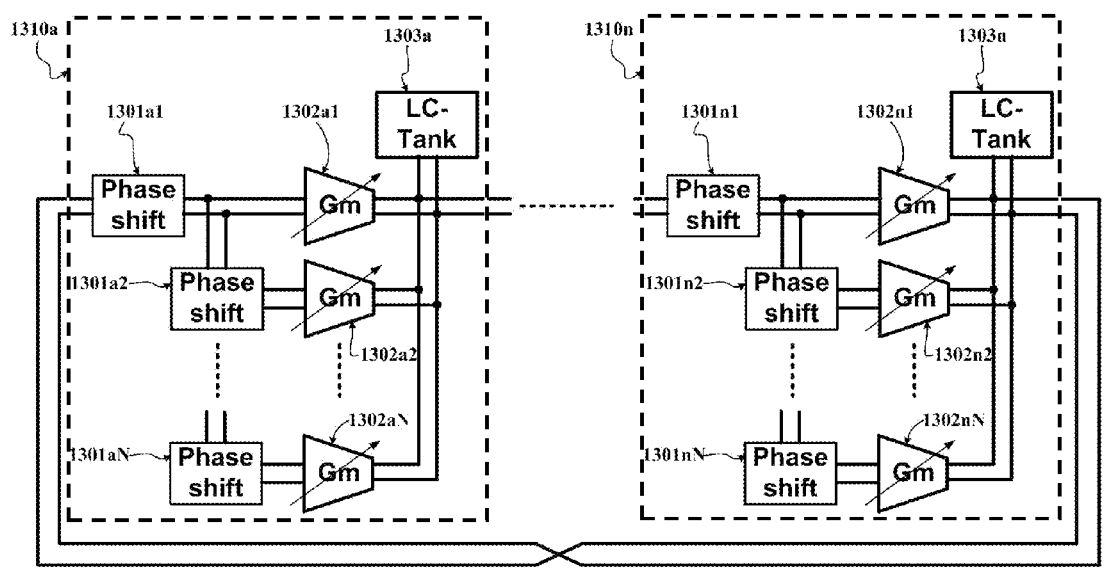
FIG. 8 depicts a schematic diagram of the multiphase phase tuning LC-oscillator in accordance with still another embodiment of the present invention.

FIG. 8 provides another embodiment of the PT LC-oscillator using the phase tuning technique. Similar to oscillator 1200, oscillator 1300 also includes a plurality of stags connected in a ring structure, where the connection from the last stage to the first stage is twisted. According to this embodiment, each stage (e.g., 1310a) has a plurality of phase shifting cells (e.g., 1301a1 to 1301aN), each providing a fixed phase shift between the input signals and the output signals. Each stage further includes a plurality of trans-conductance cells each having a tunable trans-conductance (e.g. 1302a1~1302aN) and an LC-tank, which combines the current output from the trans-conductance cells to form the output voltage. The input voltages with different cumulated phase shifts are applied to different trans-conductance cells within each stage. By controlling the trans-conductance of each trans-conductance cell (e.g. 1302a1~1302aN) and combining all the currents injected into the LC-tank, the phase of the output total current can be controlled and therefore the operating frequency of the oscillator can be tuned.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for tuning a frequency of a multiphase LC-oscillator, wherein the multiphase LC-oscillator includes a plurality of stages connected in series in a ring structure, and wherein each stage generates a delayed output from an output of a previous stage, the method including:
    imparting a phase shift to at least one portion of a stage input;
    generating first and second outputs from a phase-shifted portion and an un-shifted portion of the stage input, respectively;
    combining the first and second outputs so as to form a stage output; and
    adjusting a phase of the stage output by adjusting at least one characteristic of the first and second outputs so as to tune the oscillation frequency of the oscillator.

2. The method of claim 1, wherein the phase shift imparted to the at least one portion of the stage input is imparted by a phase delay circuit.

3. The method of claim 2, wherein the phase delay circuit includes at least a resistor and a capacitor connected in series and at least one of the resistor and the capacitor is adjustable so as to impart the phase shift to the stage input.

4. The method of claim 1, wherein the phase of the stage output is adjusted by varying at least one of amplitudes and phases of the first and second outputs.

5. A method for tuning a frequency of a multiphase LC-oscillator, wherein the multiphase LC-oscillator includes a plurality of stages connected in series in a ring structure, each stage generating a stage output from a stage input; the method including:
  imparting at least one phase shift to at least one portion of the stage input;
  combining a plurality of outputs for forming the stage output, wherein the plurality of outputs include at least one output generated from the at least one phase-shifted portion of the stage input; and
  adjusting a phase of the stage output by adjusting at least one amplitude of the plurality of outputs so as to tune the oscillation frequency of the oscillator;
  wherein the stage output is a vectorial combination of the plurality of outputs.

6. The method of claim 5, further comprising adjusting the phase shift of the stage output by varying the at least one phase shift imparted to the stage inputs.

7. The method of claim 5, wherein each of the plurality of outputs is generated by a respective differential transistor pair biased by a variable current source, the method further including varying the at least one amplitude of the plurality of outputs by adjusting the respective variable current source.

8. A tunable multiphase ring oscillator including a plurality of stages connected in series in a ring structure, each stage generating a delayed output from an output of a previous stage, wherein each stage of the tunable multiphase ring oscillator includes:
  a plurality of trans-conductance cells, each generating a trans-conductance cell output from at least one portion of a stage input;
  at least one phase shifting module for imparting at least one phase shift to the at least one portion of the stage input; and
  an oscillator unit for generating a stage output from a combination of the outputs of the plurality of trans-conductance cells in the stage; and
  wherein a phase of the stage output is adjusted by varying at least one characteristic of the plurality of trans-conductance cell outputs so as to tune the oscillation frequency of the ring oscillator;
  wherein the stage output is a vectorial combination of the plurality of trans-conductance cell outputs; and
  wherein each transconductance cell includes a differential transistor pair biased by a current source, and at least one of the current sources is variable.

9. The oscillator of claim 8, wherein the oscillator unit includes at least one inductor and at least one capacitor connected in parallel.

10. The method of claim 2, wherein the phase delay circuit includes at least one resistor and a capacitor connected in parallel and at least one of the resistors and the capacitor is adjustable so as to impart the phase shift to the stage input.

11. The method of claim 1, wherein the stage output is a vectorial combination of the first and second outputs.

12. The oscillator of claim 8, wherein each stage includes at least one inductor and at least one capacitor connected in parallel.

* * * * *